United States Patent
Beyer et al.

(10) Patent No.: US 12,356,700 B2
(45) Date of Patent: Jul. 8, 2025

(54) METHOD FOR SPLITTING SEMICONDUCTOR WAFERS

(71) Applicant: Infineon Technologies AG, Neubiberg (DE)

(72) Inventors: Christian Beyer, Freiberg (DE); Francisco Javier Santos Rodriguez, Villach (AT); Hans-Joachim Schulze, Taufkirchen (DE); Marko David Swoboda, Dresden (DE)

(73) Assignee: Infineon Technologies AG, Neubiberg (DE)

( * ) Notice: Subject to any disclaimer, the term of this patent is extended or adjusted under 35 U.S.C. 154(b) by 423 days.

(21) Appl. No.: 17/781,585

(22) PCT Filed: Dec. 9, 2020

(86) PCT No.: PCT/IB2020/001039
§ 371 (c)(1),
(2) Date: Jun. 1, 2022

(87) PCT Pub. No.: WO2021/116768
PCT Pub. Date: Jun. 17, 2021

(65) Prior Publication Data
US 2023/0005794 A1     Jan. 5, 2023

Related U.S. Application Data

(63) Continuation of application No. 16/707,579, filed on Dec. 9, 2019, now Pat. No. 11,081,393.

(51) Int. Cl.
*H01L 21/02* (2006.01)
*H01L 21/04* (2006.01)
(Continued)

(52) U.S. Cl.
CPC ..... *H10D 84/035* (2025.01); *H01L 21/02118* (2013.01); *H01L 21/0445* (2013.01);
(Continued)

(58) Field of Classification Search
CPC ........... H01L 21/8213; H01L 21/02118; H01L 21/31058; H01L 21/26506; H01L 21/6835;
(Continued)

(56) References Cited

U.S. PATENT DOCUMENTS 7,442,599 B2   10/2008  Maa et al.
7,696,065 B2    4/2010  Sato et al.
(Continued)

FOREIGN PATENT DOCUMENTS

CN    101195190 A    6/2008
CN    106029589 A   10/2016
(Continued)

OTHER PUBLICATIONS

"Dynamisch-Mechanische Analyse (DMA)", Elastizitätsmodul, Wiki Polymer Service, accessed online Dec. 2, 2019 at http://wiki.polymerservice-merseburg.de/index.php/Elastizitätsmodul#Dynamisch-Mechanische_Analyse_28DMA.29.
(Continued)

*Primary Examiner* — Vu A Vu
(74) *Attorney, Agent, or Firm* — Murphy, Bilak & Homiller, PLLC

(57) ABSTRACT

A method of splitting off a semiconductor wafer from a semiconductor bottle includes: forming a separation region within the semiconductor boule, the separation region having at least one altered physical property which increases thermo-mechanical stress within the separation region relative to the remainder of the semiconductor boule; and applying an external force to the semiconductor boule such
(Continued)

that at least one crack propagates along the separation region and a wafer splits from the semiconductor boule.

15 Claims, 8 Drawing Sheets

(51) Int. Cl.
| | |
|---|---|
| *H01L 21/223* | (2006.01) |
| *H01L 21/265* | (2006.01) |
| *H01L 21/268* | (2006.01) |
| *H01L 21/3105* | (2006.01) |
| *H01L 21/683* | (2006.01) |
| *H10D 62/832* | (2025.01) |
| *H10D 84/03* | (2025.01) |

(52) U.S. Cl.
CPC .... *H01L 21/2236* (2013.01); *H01L 21/26506* (2013.01); *H01L 21/268* (2013.01); *H01L 21/31058* (2013.01); *H01L 21/6835* (2013.01); *H10D 62/8325* (2025.01); *H01L 2221/68327* (2013.01)

(58) Field of Classification Search
CPC ............... H01L 21/268; H01L 29/1608; H01L 21/0445; H01L 21/2236; H01L 2221/68327
USPC ......................................................... 438/463
See application file for complete search history.

(56) References Cited

U.S. PATENT DOCUMENTS

| | | | |
|---|---|---|---|
| 7,867,873 B2* | 1/2011 | Murakami | H01L 21/76254 438/455 |
| 8,685,838 B2 | 4/2014 | Fukuyo et al. | |
| 9,312,165 B2* | 4/2016 | Hachigo | H01L 33/0093 |
| 9,620,415 B2* | 4/2017 | Hirata | B23K 26/0006 |
| 9,761,493 B2 | 9/2017 | Celler | |
| 9,779,968 B2* | 10/2017 | Iguchi | H01L 21/4871 |
| 10,357,851 B2* | 7/2019 | Nishino | B23K 26/0823 |
| 10,388,526 B1* | 8/2019 | Seddon | H01L 21/304 |
| 10,611,052 B1 | 4/2020 | Bubel et al. | |
| 10,770,648 B2* | 9/2020 | Akiyama | C23C 14/5833 |
| 10,828,800 B2 | 11/2020 | Bertoni et al. | |
| 10,852,240 B2* | 12/2020 | Murazawa | C30B 33/00 |
| 11,081,393 B2 | 8/2021 | Beyer et al. | |
| 11,373,863 B2 | 6/2022 | Rupp et al. | |
| 12,151,314 B2 | 11/2024 | Swoboda et al. | |
| 2001/0028385 A1 | 10/2001 | Hayashi | |
| 2005/0274702 A1 | 12/2005 | Deshi | |
| 2006/0049487 A1 | 3/2006 | Sato et al. | |
| 2006/0148210 A1 | 7/2006 | Furuta et al. | |
| 2006/0208167 A1 | 9/2006 | Morikazu | |
| 2007/0298529 A1* | 12/2007 | Maeda | B23K 26/0624 438/33 |
| 2010/0009549 A1 | 1/2010 | Sekiya | |
| 2010/0015788 A1 | 1/2010 | Sasaki et al. | |
| 2014/0038392 A1 | 2/2014 | Yonehara et al. | |
| 2014/0170792 A1 | 6/2014 | Oraw | |
| 2015/0372188 A1 | 12/2015 | Minakuchi et al. | |
| 2016/0074960 A1 | 3/2016 | Hirata et al. | |
| 2016/0158880 A1 | 6/2016 | Koitzsch et al. | |
| 2016/0336233 A1 | 11/2016 | Yonehara et al. | |
| 2017/0278931 A1 | 9/2017 | Iguchi et al. | |
| 2019/0362972 A1 | 11/2019 | Schulze et al. | |
| 2020/0064269 A1 | 2/2020 | Murazawa et al. | |
| 2020/0066542 A1 | 2/2020 | Drescher et al. | |
| 2020/0316724 A1 | 10/2020 | Donofrio et al. | |
| 2020/0381303 A1 | 12/2020 | Hoshino et al. | |
| 2021/0053148 A1 | 2/2021 | Rieske et al. | |
| 2021/0175123 A1 | 6/2021 | Beyer et al. | |

FOREIGN PATENT DOCUMENTS

| | | |
|---|---|---|
| JP | 2014104484 A | 6/2014 |
| JP | 2017098453 A | 6/2017 |
| KR | 20160099673 A | 8/2016 |
| WO | 2016114382 A1 | 7/2016 |
| WO | 2018108938 A1 | 6/2018 |

OTHER PUBLICATIONS

Jaunich, Matthias, "Tieftemperaturverhalten von Elastomeren im Dichtungseinsatz", [Low-Temperature Characteristics of Elastomers in a Gasket Insert], Thesis, Berlin, Technical University of Berlin, BAM Thesis Series, vol. 79, 2012, accessed online Dec. 2, 2019 at https://d-nb.info/1121035647/34.

Lapointe, Jerome, et al., "A simple technique to overcome self-focusing, filamentation, supercontinuum generation, aberrations, depth dependence and waveguide interface roughness using fs laser processing", Scientific Reports, 7: 499, DOI:10.1038/s41598-017-00589-8, Mar. 29, 2017, 1-13.

Menard, Kevin P., et al., "Dynamic Mechanical Analysis", Encyclopedia of Analytical Chemistry, 2017, John Wiley & Sons, Ltd.

Swoboda, Marko, et al., "Laser Assisted SiC Wafering Using Cold Split", Materials Science Forum, vol. 897, 2016 European Conference on Silicon Carbide & Related Materials (ECSCRM), Sep. 25-29, 2016, Sep. 1, 2016, pp. 403-406.

\* cited by examiner

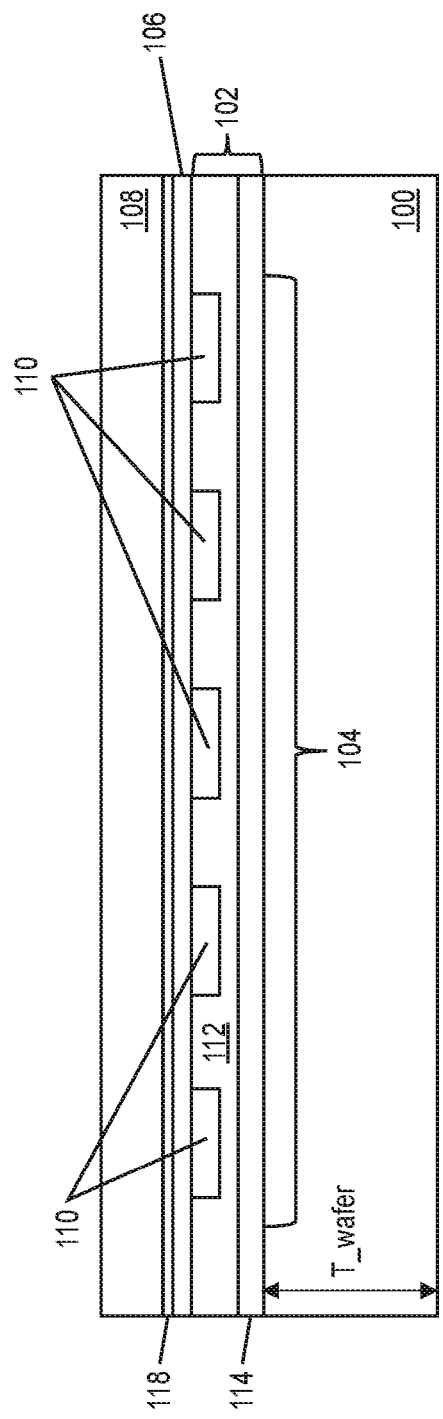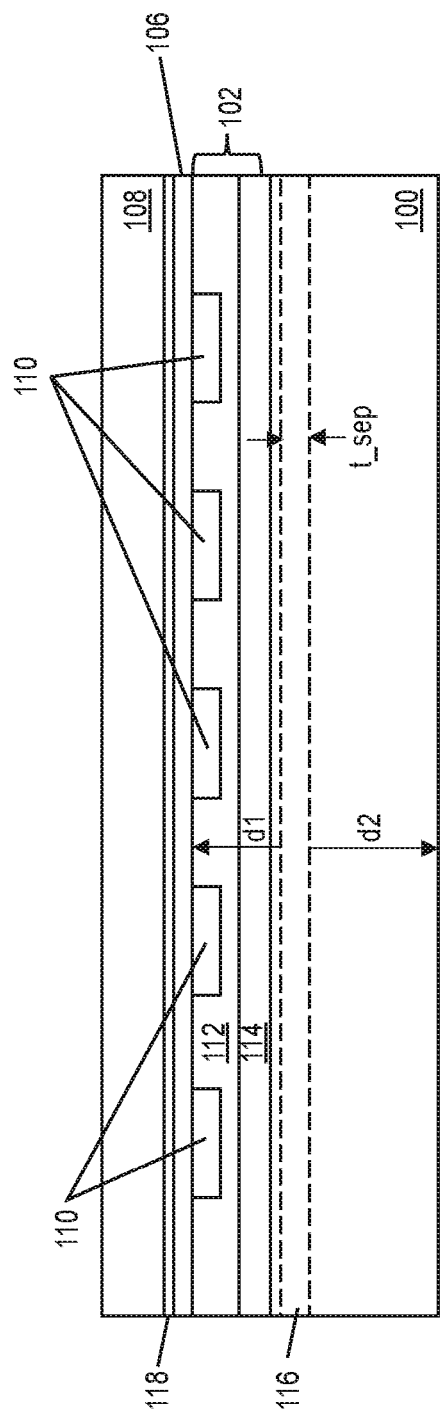

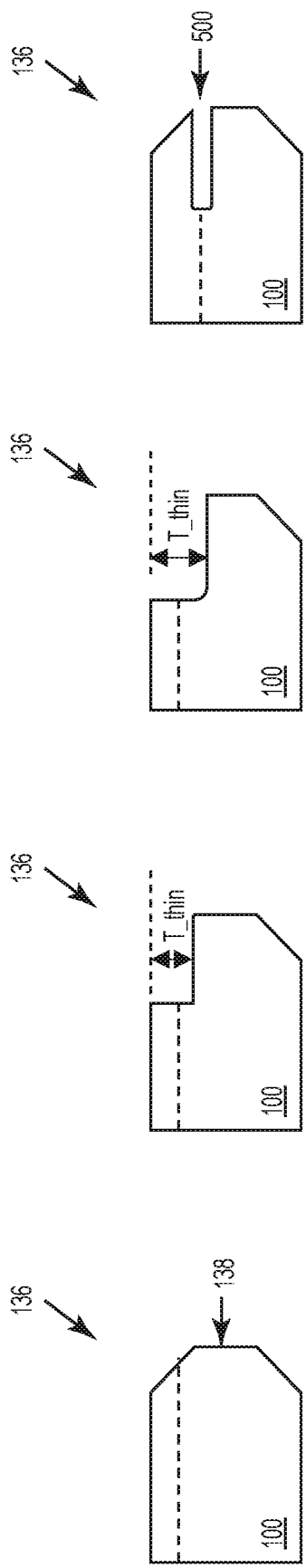

METHOD FOR SPLITTING SEMICONDUCTOR WAFERS

BACKGROUND

Wafer costs make up a significant ratio of the overall production costs of silicon carbide (SiC) semiconductor devices. Reducing these costs yield a competitive advantage. One way to reduce wafer costs is to use a standard wafer at least twice—after producing device structures, the SiC wafer is split and a thinner reclaimed wafer part that does not include the device structures is re-used to form additional device structures. Integrating SiC wafer splitting into a standard SiC production process is involved and complex, and requires changes/modification to the production process to yield efficient production.

Thus, there is a need for integration of SiC wafer splitting and SiC production processes in an efficient and cost sensitive manner.

SUMMARY

According to an embodiment of a method of splitting a semiconductor wafer, the method comprises: forming one or more epitaxial layers on the semiconductor wafer; forming a plurality of device structures in the one or more epitaxial layers; forming a metallization layer and/or a passivation layer over the plurality of device structures; attaching a carrier to the semiconductor wafer with the one or more epitaxial layers, the carrier protecting the plurality of device structures and mechanically stabilizing the semiconductor wafer; forming a separation region within the semiconductor wafer, the separation region having at least one altered physical property which increases thereto-mechanical stress within the separation region relative to the remainder of the semiconductor wafer; and applying an external force to the semiconductor wafer such that at least one crack propagates along the separation region and the semiconductor wafer splits into two separate pieces, one of the pieces retaining the plurality of device structures.

According to another embodiment of a method of splitting a semiconductor wafer, the method comprises: forming one or more epitaxial layers on the semiconductor wafer; forming a plurality of device structures in the one or more epitaxial layers; forming a metallization layer and/or a passivation layer over the plurality of device structures; attaching a carrier to the semiconductor wafer with the one or more epitaxial layers, the carrier protecting the plurality of device structures and mechanically stabilizing the semiconductor wafer; applying laser radiation to a separation region within the semiconductor wafer such that the separation region increased thereto-mechanical stress relative to the remainder of the semiconductor wafer and at least one crack propagates along the separation region; and splitting the semiconductor wafer into two separate pieces along the at least one crack, one of the pieces retaining the plurality of device structures.

According to an embodiment of a method of splitting off a semiconductor wafer from a semiconductor boule, the method comprising: forming a separation region within the semiconductor boule, the separation region having at least one altered physical property which increases thermo-mechanical stress within the separation region relative to the remainder of the semiconductor boule; and applying an external force to the semiconductor boule such that at least one crack propagates along the separation region and a wafer splits from the semiconductor boule.

Of course, the present invention is not limited to the above features and advantages. Indeed, those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 1A through 1E illustrate cross-sectional views of a semiconductor wafer during different stages of a wafer splitting process, according to an embodiment.

FIGS. 5A through 5D illustrate cross-sectional views of a bevelled edge of the semiconductor wafer, according to different embodiments.

DETAILED DESCRIPTION

Figure 1C:
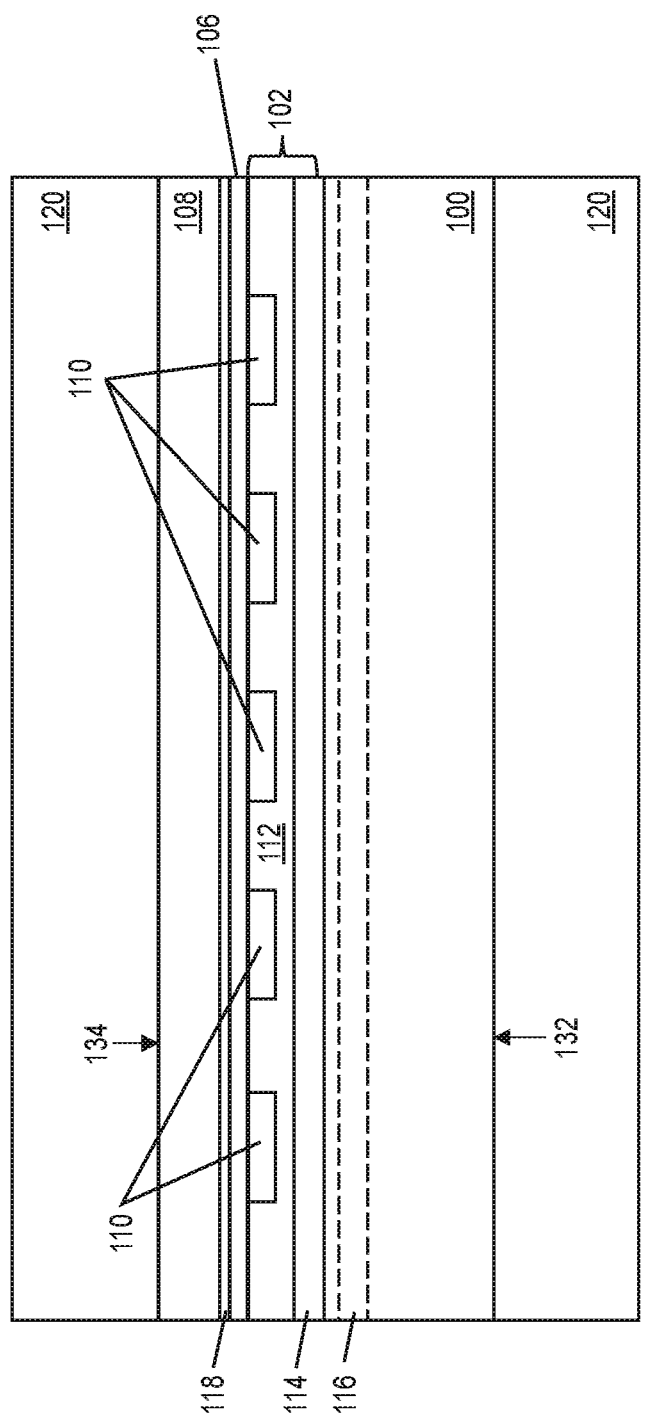

Notably, modifications and other embodiments of the disclosed invention(s) will come to mind to one skilled in the art having the benefit of the teachings presented in the foregoing descriptions and the associated drawings. Therefore, it is to be understood that the invention(s) is/are not to be limited to the specific embodiments disclosed and that modifications and other embodiments are intended to be included within the scope of this disclosure. Although specific terms may be employed herein, they are used in a generic and descriptive sense only and not for purposes of limitation.

The embodiments described herein are directed to a semiconductor wafer splitting process that reduces manufacturing costs associated with producing semiconductor devices. While emphasis is placed on SiC wafers and SiC devices produced using SiC wafers, the embodiments described herein are not intended to be limited to SiC wafers and may be used with other semiconductor wafer technologies such as silicon (Si), gallium arsenide (GaAs), gallium nitride (GaN), sapphire, etc. Device structures are produced in a base (thick) semiconductor wafer and the base wafer is subsequently split into a thinner device wafer, which includes the device structures, and a thinner reclaimed wafer. The reclaimed wafer may be processed and further devices produced within the reclaimed wafer.

The wafer splitting technique described herein includes at least two main steps: (i) forming a separation region within a semiconductor wafer and which has at least one altered physical property which increases thermo-mechanical stress within the separation region relative to the remainder of the semiconductor wafer; and applying an external force to the semiconductor wafer such that at least one crack propagates along the separation region and the semiconductor wafer splits into two separate pieces.

In some embodiments, forming the separation region includes forming microscopic cracks that are at least partially disconnected from one another within the separation region. The microscopic cracks connect to one another in response to the external force applied to the semiconductor wafer, forming the at least one crack which propagates along the separation region and which splits the semiconductor wafer into two separate pieces. Material waste/loss may be reduced by first creating the microcracks and subsequently connecting the microcracks, as opposed to creating connected cracks in a single step/process.

The external force applied to the semiconductor wafer may involve ultrasonic vibrations or application of a polymer layer, for example. Splitting a semiconductor wafer using just ultrasonic vibrations or a polymer layer without first creating a separation region having at least one altered physical property which increases thermo-mechanical stress within the separation region may result in uncontrolled splitting and/or unwanted surface structures such as Wallner lines, river lines, etc., owing to the effect of sound reflections during the splitting which occurs as the at least one crack progresses.

Described next are various embodiments of the semiconductor wafer splitting process.

FIGS. 1A through 1E illustrate cross-sectional views of a semiconductor wafer 100 during different stages of the splitting process, according to an embodiment. As explained above, the semiconductor wafer 100 may be any type of wafer used to produce semiconductor devices. For example, the semiconductor wafer may be a SiC wafer such as 4H—SiC and may have a thickness (T_wafer) which may vary depending on wafer diameter. Typically, 4 inch and 6 inch SiC wafers have a thickness of 350 µm (microns) with an accuracy of, e.g., at most ±40 µm or at most ±25 µm. For larger SiC wafer diameters, the thickness may be higher. The wafer splitting process described herein may also be used with other SiC polytypes and/or other semiconductor materials, as explained above (e.g., Si, GaAs, GaN, sapphire, etc.), with corresponding adaptations of the process parameters.

FIG. 1A shows the semiconductor wafer 100 after one or more epitaxial layers 102 are formed on the semiconductor wafer 100, device structures 104 are formed in the one or more epitaxial layers 102, a metallization layer and/or a passivation layer 106 (e.g., at least one passivation layer) is formed over the device structures 104, and a carrier 108 is attached to the semiconductor wafer 100 with the one or more epitaxial layers 102. Layer 106 is shown in the cross-sectional as a continuous layer, but instead may be discontinuous. For example, in the case of a passivation layer, layer 106 may be present only above the device structures 104. In the case of a metallization layer, layer 106 may be patterned. The carrier 108 protects the device structures 104 from damage and mechanically stabilizes the semiconductor wafer 100 during and/or after the splitting process.

Doping regions 110, 112, 114 of the device structures 104 are produced by implantation with subsequent annealing steps or by doping during the epitaxial process. For example, a first deposited epitaxial layer 114 may be an n-doped drain or emitter layer with a thickness ranging, e.g., between 10 µm and 50 µm for power MOSFET (metal-oxide-semiconductor field effect transistors) or power diode devices, or a p-doped emitter layer for IGBT (insulated gate bipolar transistor) devices. A second epitaxially deposited layer (not shown) may be deposited as a buffer layer for preventing punch-through of the space charge layer towards the emitter/drain layer 114. The thickness of the buffer layer is typically 1 µm to 40 µm or 2 µm to 30 µm. A n-type drift zone layer 112 may then be deposited by an epitaxial technique. The thickness of the drift zone layer 112 depends on the target breakdown voltage (for 1200 V devices typically in the range between 8 µm and 12 µm and for 3.3. kV devices between 25 µm and 35 µm). The doping level of the drift zone layer 112 also may be adjusted according to the desired breakdown voltage (for 1200 V devices typically about 1016 cm-3 and for 3.3 kV devices a few times 1015 cm-3). Front side device structures 110, such as p-body and source regions for power MOSFETs or IGBTs or p-emitter for power diodes, may be formed by masked ion implantation with subsequent annealing steps. For switchable devices, a gate structure is also realized in the form of planar or trench-based gates.

After device formation, the semiconductor wafer 100 has a front side with the device structures 104 and a front side metallization layer and/or passivation layers 106. The device structures 104 may be structures of a semiconductor device, for example a MEMS (microelectromechanical systems) and/or a MOEMS (micro-opto-electro-mechanical system) device, a diode such as an MPS (merged-pin-Schottky) diode, Schottky diode, MOS-gated diode, etc. or a transistor device such as a MOSFET, JFET (junction FET), IGBT, fin-FET, thyristor, etc. or a combination thereof. If the device structures 104 include a Schottky contact, the front side metallization layer 108 may include a Schottky contact metal. In addition, or as an alternative in the case of no Schottky contact, the front side metallization layer 108 may include an Ohmic contact metal.

FIG. 1B shows the semiconductor wafer 100 after forming a separation region 116 within the semiconductor wafer 100. The separation region 116 has at least one altered physical property which increases thereto-mechanical stress within the separation region 116 relative to the remainder of the semiconductor wafer 100. The carrier 108 which protects the device structures 104 from damage and mechanically stabilizes the semiconductor wafer 100 during and/or after the splitting process may be attached to the semiconductor wafer 100 with the one or more epitaxial layers 102 before or after forming the separation region 116. The carrier 108 may be a single piece of material or a carrier system that includes multiple layers and/or complex structures.

The shape of the carrier 108 may be similar or even identical to the shape of the semiconductor wafer 100. The semiconductor wafer 100 may have a flat cut into one or more sides for indicating the crystallographic planes of the wafer 100, whereas the carrier 108 may not have such flats. The carrier 108 may have a larger diameter than the semiconductor wafer 100, e.g., at least 0.1% larger. The diameter of the carrier 108 may be, e.g., at most 3 times or at most 2 times or at most 1.5 times the diameter of the semiconductor wafer 100. Either a mechanically stabilizing part of the carrier 108 and/or an optional fixing layer of the carrier 108 may fully cover the front side of the semiconductor wafer 100, e.g., as shown in FIGS. 1A through 1E. Alternatively, either the mechanically stabilizing part and/or an optional fixing layer of the carrier 108 divide the front (active) side of the semiconductor wafer 100 into sections along the surface of the wafer 100 as shown in FIG. 2. According to this embodiment, either the mechanically stabilizing part and/or an optional fixing layer of the carrier 108 may have the shape of a ring, a grid, and/or may only be present in peripheral regions of the semiconductor wafer 100, e.g., an intersected ring at the outer/peripheral part of the wafer 100. In each case, the topography of the device structures 104 may be embedded in the carrier 108, e.g., by a potting material and/or an adhesive layer and/or a non-adhesive layer 118 between the carrier 108 and the semiconductor wafer 100 with the one or more epitaxial layers 102 and the front side metallization 106.

The carrier 108 may be either temporarily (reversibly) or permanently attached to the semiconductor wafer 100 with the one or more epitaxial layers 102. In the case of temporary attachment, the carrier 108 may include an adhesive tape having thermal or UV release, an adhesive (organic or inorganic composition) layer in combination with a rigid support such as a transparent substrate, non-transparent substrate, polymer film, etc., a fixed or mobile electrostatic chuck, a fixed or mobile vacuum chuck, a mobile vacuum carrier, etc. In the case of permanent attachment, the carrier 108 may include hot embossed glass, e.g., in the form of a grid, a ring, etc., a glass grid and/or ring attached via solder glass, a glass grid and/or ring attached via a laser welding process, etc., a substrate such as a semiconductor, metal, insulator (e.g. glass) substrate joint to the semiconductor wafer 100 with the one or more epitaxial layers 102 via one or more diffusion soldering layers, a substrate joined to the semiconductor wafer 100 with the one or more epitaxial layers 102 via aerobic and or anaerobic adhesives or other binding components, etc.

The separation region 116 allows for splitting of the semiconductor wafer 100 at a defined position. Otherwise, the splitting would take place at a random position that may be influenced by crystal damages, etc. Furthermore, without the defined separation region 116, reproducible manufacturing would be more difficult since only some of device wafers and/or reclaimed wafers could be used. The well-defined separation region 116 significantly reduces material losses (also referred to as kerf loss) during wafer splitting. A thickness (t_sep) of the separation region 116 may define the kerf loss. For example, losses may originate from the vertical extent of the microscopic cracks and additional losses due to chemical, mechanical, electrochemical and/or plasma material removal.

The position of the separation region 116 may be chosen such that, after defining the device structures 104, the distance 'd1' to the front side of the semiconductor wafer 100 with the one or more epitaxial layers 102 is sufficiently high to allow for mechanical handling of the thinner device wafer which results from the splitting process, and such that the distance d1 to the front side is sufficiently low and therefore the distance 'd2' to the backside is sufficiently high so that the reclaimed wafer which results from the splitting process may still be processed. In one embodiment, the separation region 116 is close to the interface between the wafer 100 and the first deposited epitaxial layer 114 (substrate/drain layer for power MOSFETs or substrate/emitter layer for diodes). Typically, the distance between the separation region 116 and the interface between the wafer 100 and the first deposited epitaxial layer 114 is less than 10 μm or even less than 4 μm or even less than 2 μm.

In general, thereto-mechanical stress may be increased within the separation region 116 compared to the remainder of the semiconductor wafer 100, thus simplifying splitting of the semiconductor wafer 110 into a device wafer and a reclaimed wafer, e.g., by applying mechanical force and/or thermal stress to the wafer 100. The thereto-mechanical stress generated within the separation region 116 may be sufficient to bring about the wafer splitting, without necessarily requiring application of an external force. For example, laser radiation may be applied to the separation region 116 such that the separation region 116 has increased thermo-mechanical stress relative to the remainder of the semiconductor wafer 100 and at least one crack propagates along the separation region 116, thereby enabling wafer splitting without the use of an external force. However, an external force may still be applied to lift off one of the split wafer pieces and/or to aid in the wafer splitting.

In one embodiment, the separation region 116 is formed by damaging the material of the semiconductor wafer 100 at a targeted position. For example, in the case of SiC as the wafer material, the SiC material may be damaged. In some cases, SiC may be at least partially decomposed, for instance, into Si and C. This may be done, e.g., by creating a plasma in the SiC material at the targeted position within the semiconductor wafer 100. At least some of the atoms in the plasma may reform to carbon clusters and silicon material, e.g., in the form of amorphous carbon and/or amorphous silicon. In addition or as an alternative, at least some of the atoms may re-crystallize, semi-crystallize and/or re-organize, for example to at least one polytype of SiC (e.g., 4H—SiC, 6H—SiC, or 3C—SiC) or amorphous SiC where both Si and C phases are amorphous. In some examples, the separation region 106 may comprise at least one of crystalline portions of at least one polytype of SiC or silicon or carbon (e.g., in the form of microcrystalline), amorphous portions of SiC or silicon or carbon, and/or cavities.

In one embodiment, a plasma is created in the material at the targeted position within the semiconductor wafer 100 by focusing laser radiation at the targeted position within the semiconductor wafer 100. The semiconductor wafer 100 may be irradiated through the backside opposite the device structures 104 or through the front side with the device structures 104, and focused to a well-defined region within the wafer 100 to ignite a plasma within the wafer 100 and which decomposes the laser irradiated semiconductor material into its constituent components. For example, in the case of SiC, laser irradiated SiC decomposes as follows: SiC→Si+C. The interaction with the laser radiation may result in a different material phase, e.g., as described above, and/or in microscopic cracks within the semiconductor wafer 100. Irradiating the semiconductor wafer 100 with laser radiation through the front side is preferably be done before producing the device structures 104 or at least before producing the front side metallization 106, since the laser radiation might damage the device structures 104 and since the metallization 106 is not transparent for laser radiation.

If the separation region 116 has already been pre-defined, e.g., by implantation as explained above briefly and as explained below in more detail, the laser radiation that is applied to the separation region 116 may be in a resonant regime where single-photon processes (e.g., single-photon absorption) dominate, i.e., a probability of multi-photon processes is small (e.g. at least ten times smaller than the probability of a single-photon process). In the resonant regime, the band gap of the material within the separation region 116 may be, e.g., in the range of the photon energy of the laser radiation (e.g. with a detuning of at most ±5% or at most ±1% or at most ±0.1% or at most ±0.01% of the band gap, depending on the laser energy). The laser radiation may be absorbed in the separation region 116 and may lead to further damage of the separation region 116 (e.g. decomposition of SiC in the case of a SiC wafer 100), such that no or only a small mechanical force and/or thermal stress is needed to split the semiconductor wafer 100 at the separation region 116.

The separation region 116 may be defined, or in the case of a pre-defined layer previously formed, e.g., by ion implantation, further defined, by focusing laser radiation to a well-defined region such as a region with at most the targeted thickness, e.g. at most 50% of the targeted thickness, of the separation region 116 within the semiconductor wafer 100. In this case, the laser radiation may be in an off-resonant regime such that a probability of single-photon processes in the separation region 116 is small and mostly multi-photon processes (in particular, multi-photon absorption) may have to be accounted for. For example, the off-resonant regime may be achieved if the band gap of the separation region 116 is larger than (e.g., at least twice of or at least ten times of) the photon energy of the laser radiation. In the case of a multi-photon process, damage creation may be further supported by a pre-defined layer (e.g., formed by ion implantation) that increases absorption within the region where the focal point of the laser radiation is positioned.

The laser radiation may be pulsed laser radiation. The parameters of the laser radiation such as pulse duration, repetition rate, pulse energy, intensity, wavelength, pulse shape, polarization, etc. are interconnected and may be optimized according to a specific application or requirement. For example, the laser radiation may have a pulse duration of 100 fs to 100 ns (e.g. 50 ps to 10 ns), a repetition rate of 10 kHz to 10 MHz, a pulse energy of 100 nJ to 50 µJ, and a peak wavelength of 400 nm to 2100 nm. (e.g., 900 nm to 1200 nm).

The laser radiation may be applied along laser lines (also referred to as scribe lines) that run essentially parallel to one another. For each laser line, a laser beam is scanned along the line. The speed of the laser scanning may be so fast that neighboring single laser shots can be distinguished, e.g. do not overlap. Here, a single laser shot may correspond to the damage created by a single pulse of laser radiation as shown in FIG. 3.

Figure 3:
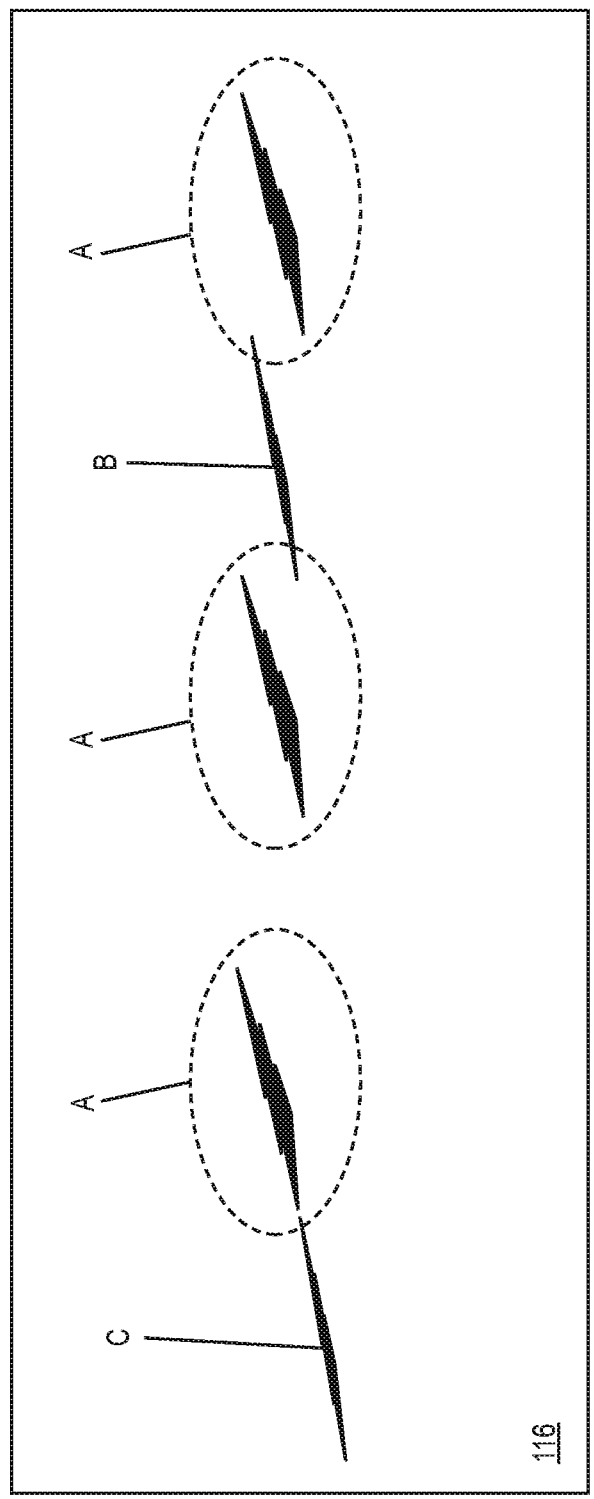
FIG. 3 illustrates a portion of a separation region formed within the semiconductor substrate and which includes microscopic cracks that are at least partially disconnected from one another within the separation region.

In FIG. 3, which shows a small section of the separation region 116, the dashed ovals labelled 'A' correspond to locations of individual/single laser shots. At each single laser shot location 'A', material of the separation region 116 is decomposed and microscopic cracks appear that extend along a crystal plane of the material of the wafer as indicated by the additional microscopic cracks labelled 'B' and 'C'. The microscopic cracks 'A', 'B', 'C' formed within the separation region 116 are at least partially disconnected from one another. The microscopic crack labelled 'C' is produced by tensions between other microscopic cracks 'A' and not directly formed by a laser shot. For 4H—SiC, the growth direction of the semiconductor wafer 100, which corresponds to the vertical direction along which the wafer 100 has a thickness T_wafer, may be slightly tilted to the main crystal axis, typically by 4° (also referred to as off-axis angle). Therefore, the crystal planes are tilted.

If the separation region 116 were to have only a single large crack, which would be planar but tilted, the separation region 116 would be tilted by 4° with respect to the lateral directions (i.e., the directions perpendicular to the vertical direction). Along the entire diameter of the semiconductor wafer 100 this would result in tremendous losses. Accordingly, for SiC, the splitting process may be useful for 4H—SiC if the separation plane is not planar but has a zig-zag shape/saw-tooth shape. The microscopic cracks 'A', 'B', 'C' are subsequently connected to enable splitting of the semiconductor wafer 100, as described in more detail further below.

In addition or alternatively to damaging the semiconductor wafer 100 by laser radiation to form the separation region 116, the material of the semiconductor wafer 100 may be damaged at the targeted position by implanting ions into the semiconductor wafer 100 at a depth corresponding to the targeted position within the wafer 100 to produce and/or pre-define the separation region 116. The ions may result directly in higher absorption, e.g., due to higher absorption rate in the separation region 116 where the majority of implanted ions reside. In the case of SiC as the material of the semiconductor water 100, the ions may lead to conversion of the crystal structure of the SiC wafer into a different material, for example into a different poly-type (e.g., from 4H—SiC to 3C—SiC) and/or into a different crystallinity and/or into amorphous SiC and/or into silicon and carbon (amorphous or crystalline), such that the absorption coefficient at the wavelength of the laser radiation is increased in the separation region 116. The ions may also result in decomposition of the material of the semiconductor wafer 100 in the separation region 116.

In one embodiment, the ions may be selected from the group consisting of nitrogen ions, phosphorus ions, hydrogen ions, and helium ions. For example, atoms such as nitrogen and/or phosphorus atoms may be implanted into the separation region 116, with an implantation dose resulting in an amorphous layer and/or or cavities being created. In addition or alternatively, helium ions or protons may be implanted to create a local damaged layer within the separation region 116. Light ions such as helium and hydrogen penetrate more deeply in the semiconductor wafer 100 as compared to heavier ions for the same energy, increasing the depth of the separation region 116 if desired. Light ions like helium and hydrogen may create vacancy clusters and damaged layers preferentially in the end-of-range of the implantation so that the splitting process can be facilitated in this region. Phosphorous and/or nitrogen are suitable for realizing highly damaged layers in SiC. In the case of phosphorous and/or nitrogen, the implantation dose may be chosen such that an amorphous layer and/or cavities are created in the separation region 116. Optionally, channelling may be exploited during implantation which results in a lower surface damage of the surface into which the implantation is performed. The ions may be implanted before the one or more epitaxial layers 102 are formed. For example, the ions may be implanted through the surface of the semiconductor wafer 100 onto which the one or more epitaxial layers 102 are to be formed.

After ion implantation, the device structures 104 may be produced. After or before producing the device structures 104, laser radiation as described above may be irradiated through the semiconductor wafer 100, with the focal point being roughly positioned at the implantation layer. The ions and/or the semiconductor material that has been converted by the ions will have an increased absorption compared to the rest of the wafer 100, thus improving the decomposition of, e.g., SiC into Si and C by an enhanced local heating of the wafer 100. For example, a combination of a multi-photon and single-photon processes may take place within the pre-defined ion implantation layer in order to increase the thereto-mechanical stress within the separation region 116 relative to the remainder of the semiconductor wafer 100.

The separation region 116 may be formed before or after for the device structures 104 are formed. In some embodiments, a part of the separation region 116 may be formed before the device structures 104 are formed, e.g. even before epitaxial growth, and another part of the separation region 116 may be formed after the device structures 104 are formed.

In one embodiment, the separation region 116 is formed by both laser irradiation and ion implantation of the semiconductor wafer 100. Particularly, the material of the semiconductor water 100 may be damaged at the targeted position within the semiconductor wafer 100 by implanting ions into the semiconductor wafer 100 at a depth corresponding to the targeted position within the wafer 100. After the ions are implanted, laser radiation is then focussed at the targeted position within the semiconductor wafer 100. According to this embodiment, the implanted ions increase an absorption coefficient in the separation region 116 at a wavelength of the laser radiation which further increases the thermo-mechanical stress within the separation region 116 relative to the remainder of the semiconductor wafer 100.

After formation of the separation region 116, an external force is applied to the semiconductor wafer 100 such that at least one large crack propagates along the separation region 116 and the semiconductor wafer 100 splits into two separate pieces. The force equilibrium of surface energy, bonding forces and (optional) external pressure are shifted in favor of the external force such that internal binding forces still present within the semiconductor wafer 100 are overcome at the separation region 116, thus resulting in crack propagation. Alternatively, the laser radiation propagates enough cracks along the separation region 116 such that application of an external force is not necessarily required to split the semiconductor wafer 100. However, an external force may still be applied to aid the lift-off process of the split wafer pieces and/or the wafer splitting.

The separation region 116 has at least one altered physical property which increases thermo-mechanical stress within the separation region 116 relative to the remainder of the semiconductor wafer 100, as explained above. For example, laser radiation and/or ion implantation may be used to alter at least one physical property of the separation region 116, Laser radiation may form microscopic cracks 'A', 'B', 'C' in the separation region 116 whereas implanted ions may increase the absorption coefficient in the separation region 116 at a wavelength of the laser radiation. The localized increase in thereto-mechanical stress restricts crack propagation to the separation region 116 in a controlled and reproducible manner. The localized increase in thereto-mechanical stress may be sufficient to propagate enough cracks along the separation region 116 such that application of an external force is not necessarily required to split the semiconductor wafer 100. However, in other embodiments, a force is used to aid in splitting the semiconductor wafer 100.

In one embodiment, the external force applied to the semiconductor wafer 100 for splitting the wafer 100 along the separation region 116 includes applying ultrasonic vibrations (sound waves) to the semiconductor wafer 100. The ultrasonic vibrations may have a frequency in the kHz regime, e.g., at least 20 kHz and at most 60 kHz (e.g., 30-50 kHz, e.g. 35-45 kHz). The semiconductor wafer 100 may be placed in a container filled with a fluid such as pure water, deionized water, solvents in general, dimethylformamide, isopropyl alcohol, methanol, and/or ethanol when applying the ultrasonic vibrations. For example, a device similar to an ultrasonic cleaning apparatus may be used to apply the ultrasonic waves to the semiconductor wafer 100.

Figure 1D:
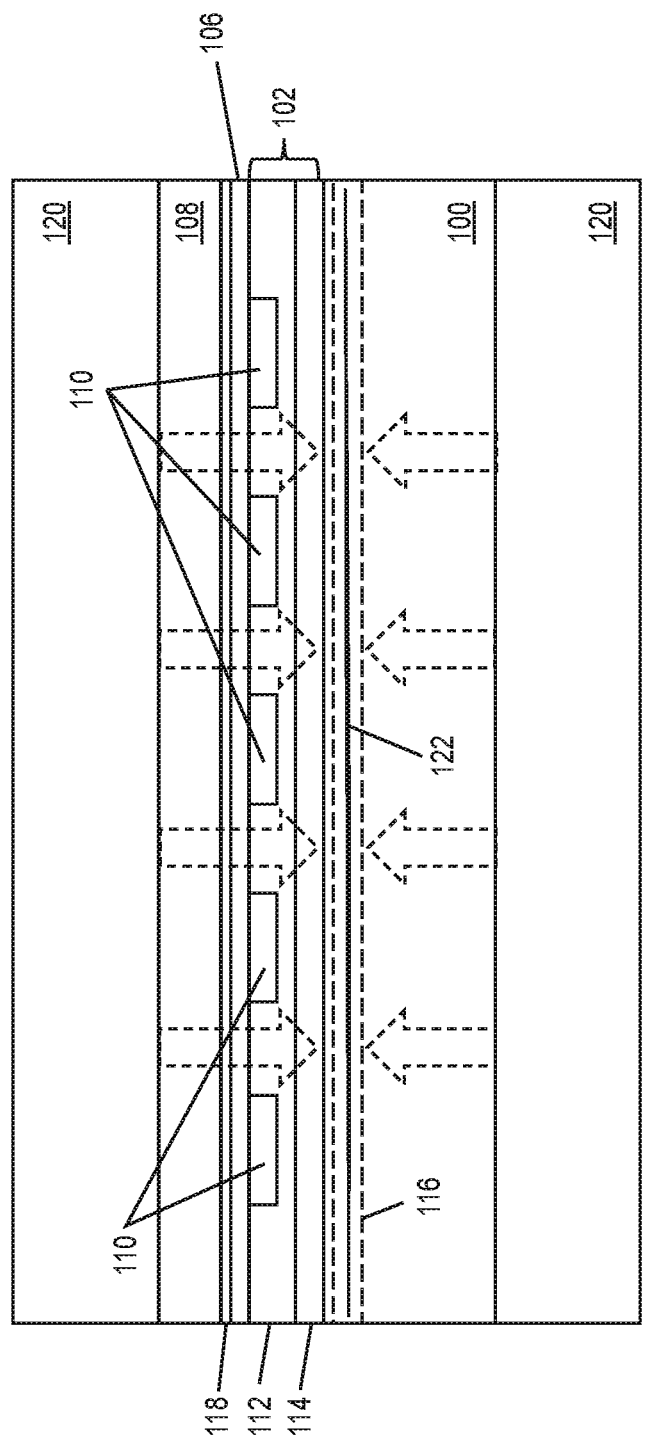
Figure 1E:
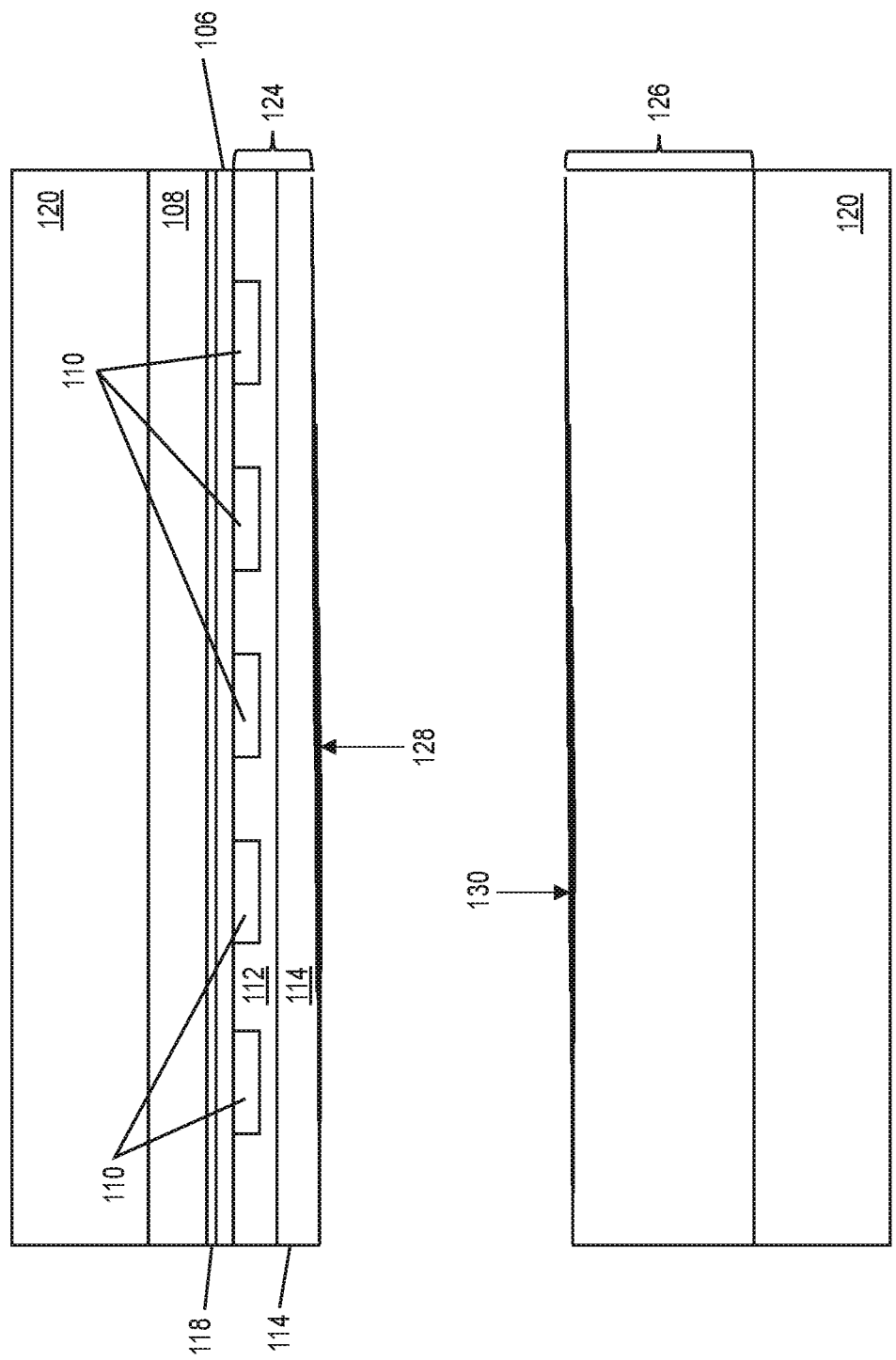
Figure 2:
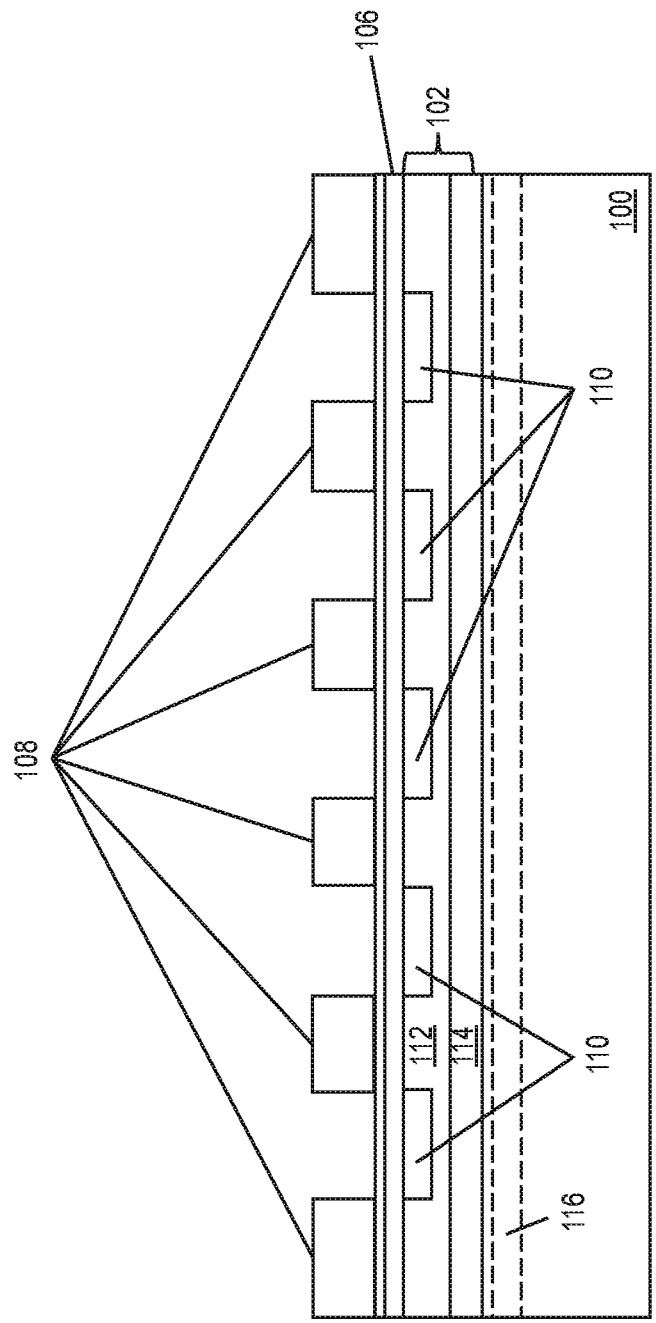
FIG. 2 illustrates a cross-sectional view of another embodiment of a carrier used during the wafer splitting process.

FIGS. 1C through 1E illustrate another embodiment of applying the external force to the semiconductor wafer 100 for splitting the wafer 100 along the separation region 116. According to this embodiment, a polymer 120 is applied to the semiconductor wafer 100 and/or the carrier 108 as shown in FIG. 1C. The polymer 120 has a CTE (coefficient of thermal expansion) different from a CTE of the semiconductor wafer 100. The polymer 120 and semiconductor wafer 100 are the then subjected to a temperature process during which the polymer 120 imparts mechanical stress to the semiconductor wafer 100 as indicated by the dashed arrows in FIG. 1D. The mechanical stress causes at least one large crack 122 to propagate along the separation region 116 such that the semiconductor wafer splits 100 into two separate pieces 124, 126 as shown in FIG. 1E. One piece 124 retains the device structures 104. The other piece 126 is available for subsequent device processing.

In the case of the separation region 116 including microscopic cracks 'A', 'B', 'C' as explained above in connection with FIG. 3, the mechanical stress imparted to the semiconductor wafer 100 causes the microscopic cracks 'A', 'B', 'C' to connect to one another to form the large crack 122 which splits the wafer 100. That is, the individual microscopic cracks 'A', 'B', 'C' shift with respect to one another in response to the external force. The separation region 116 may thus not be viewed as a single layer within the semiconductor wafer 100, but rather a combination of several microscopic cracks 'A', 'B', 'C' that are only combined during the splitting. In the case of SiC as the material of the semiconductor wafer 100, combining the microscopic cracks 'A', 'B', 'C' results in both separate pieces 124, 12.6 having a separation surface 128, 130 with a saw-tooth pattern. The resulting device piece 124 and the reclaimed piece 126 thus do not have a smooth planar surface in the case of SiC. In one embodiment, after the semiconductor wafer 100 is split into the two separate pieces 124, 126, each separation surface 128, 130 which results from the large crack 122 propagating along the separation region 116 is smoothed. Residual decomposed material may be present at the separation surface 128, 130 of each piece 124, 126 split from the wafer 100, and may be removed by a cleaning process.

The polymer 120 may be attached to the semiconductor wafer 100 with the carrier 108 already attached to the wafer 100. The polymer 120 may be attached at the backside 132 of the semiconductor wafer 100 that faces away from the front side and the carrier 108. The polymer 108 instead may be attached to an outer side 134 of the carrier 108 which faces away from the semiconductor wafer 100. In this case, the carrier 108 is located between the polymer 120 and the semiconductor wafer 100. According to another embodiment, the polymer 120 may be attached to both the backside 132 of the semiconductor wafer 100 and the outer side 134 of the carrier 108. For example, if a glass grid or a glass ring is used as the carrier 108, the polymer 120 may be applied at the backside 132 of the semiconductor wafer 100 with the one or more epitaxial layers 102 and additionally at the outer side 134 of the carrier 108. In general, a further layer (e.g., a bonding layer, such as an adhesive, and/or a layer that simplifies later removal of the polymer 120) may be applied between the polymer 120 and the side at which the polymer 120 is applied.

The polymer 120 may be selected based not only CTE, but also by taking into account multiple parameters. The CTE of the polymer 120 should be different from the CTE of the semiconductor wafer 100. For example, the CTE of the polymer 120 is preferably larger than the CTE of the semiconductor wafer 100. In addition to the CTE difference, the linear course of the CTE in the polymer 120 over a wide temperature range may be advantageous for successful separation.

Furthermore, the polymer 120 should have sufficiently high thermal conductivity. In one embodiment, one or more fillers such as ZnO and/or carbon black are added to the polymer 120 before the temperature process. The filler(s) increase the thermal conductivity of the polymer 120 and reduce a slope of a storage modulus of the polymer 120, extending the linear course of the CTE in the polymer 120 over a smaller temperature range. By adding ZnO and/or carbon black to the polymer 120, percolation chains that form can significantly increase thermal conductivity in the polymer 120. If a filler material is used, the polymer material may be chosen such that the filler material is easily homogeneously distributed throughout the polymer 120.

For sufficiently large coefficients of heat transfer to the semiconductor wafer 100, adding one or more fillers such as ZnO and/or carbon black to the polymer reduces by more than half the time needed to achieve a temperature differential that generates sufficient mechanical stress for splitting the semiconductor wafer 100 along the separation region 116. At the same time, the rise in modulus of elasticity is distributed over a greater temperature range since it is already apparent at higher temperatures by comparison with an unfilled polymer. As a result, there is less wafer breakage in the manufacturing process and a higher split efficiency is provided. One example for the polymer 120 is PDMS (polydimethylsiloxane), usually with at least one filler. PDMS may generate high adhesion to a surface. Attaching may thus require some pre-processing or conditioning to allow for damage-free polymer removal. For example, a foil may be positioned between the polymer and the surface to which the polymer is attached.

Attaching the polymer 120 is typically performed at higher temperatures (e.g., above room temperature but below 300° C.). A binding process may be applied to allow for a firm bond throughout the entire temperature process. For example, before applying the polymer 120, the application surface of the polymer 120 and/or semiconductor wafer 100 and/or carrier 108 may undergo chemical and/or physical surface treatment (for example, with a plasma) to allow for firm bonding. An indirect temporary cold plasma activation process may be used to ensure subsequent easy removal of the polymer 120. This has the advantage that ambivalent characteristics of the structure-property relationships are achievable here and that no significant thermal diffusion processes are to be expected at the low temperatures that occur. Diffusion may, e.g., be problematic in the case of metallic impurities, such as impurities originating from metallic layers of the device structures 104. The polymer binding is sufficient for execution of the splitting operation, but sufficiently weak for complete removal of the polymer 120 in subsequent steps.

Another additional or alternative approach is to apply a binding (sacrificial) layer between the semiconductor wafer 100 with the one or more epitaxial layers 102 (and/or, if applicable, carrier 108) and the polymer 120. The binding layer may be chosen such that adhesion to the polymer 120 can be reduced, e.g., with chemicals or with thermal treatment.

The polymer 120 may not be produced directly on the semiconductor wafer 100 with the one or more epitaxial layers 102 and/or directly on the carrier 108. Rather, the polymer 120 may be pre-produced and subsequently attached to the semiconductor wafer 100 with the one or more epitaxial layers 102 and/or carrier 108. In other embodiments, the polymer 120 is produced directly on the semiconductor wafer 100 with the one or more epitaxial layers 102 and/or carrier 108, e.g., via spraying or coating.

After attaching the polymer 120 to the semiconductor wafer 100 with the one or more epitaxial layers 102 and/or carrier 108, the temperature process is carried out. In one embodiment, the temperature process is selected such that the polymer 120 undergoes a partial glass transition and a partial crystallization during the temperature process. This may include a first phase during which the polymer 120 and the semiconductor wafer 100 undergo a temperature gradient from a starting temperature down to room temperature, the starting temperature being 300° C. or less but above room temperature, and a second phase during which the polymer 120 and the semiconductor wafer 100 are further cooled down to a lower temperature. For example, the lower temperature may correspond to ±40° C. of a boiling temperature of a cooling liquid (e.g., liquid nitrogen) used for cooling. The lower temperature may be, for example, −170° C., in particular for the entire wafer 100. In some examples, the lower temperature may be below a glass transition temperature (Tg) of the polymer 120, depending on the cooling conditions (e.g., the cooling liquid.

Figure 4B:
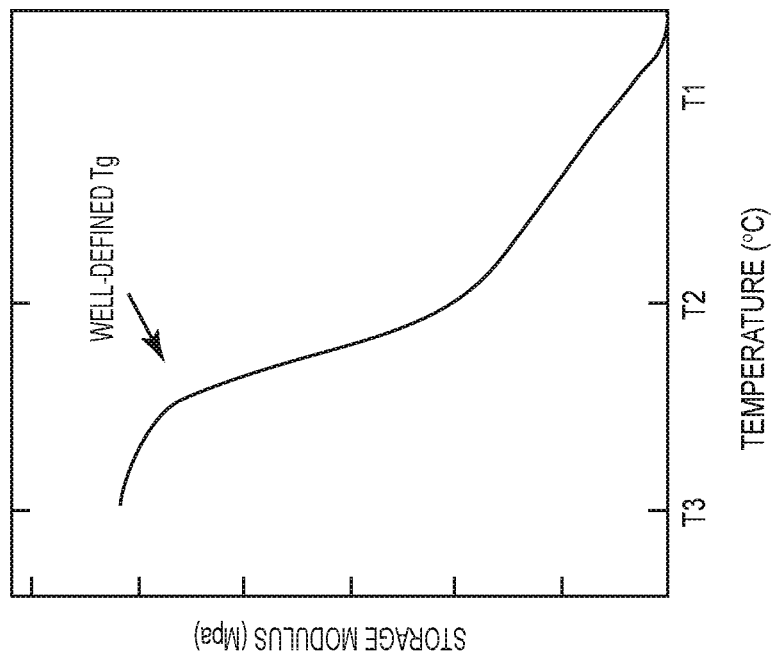
FIG. 4B illustrates a plot of storage modulus versus temperature for the polymer in FIG. 4A, but with one or more fillers contained in the polymer.
Figure 4A:
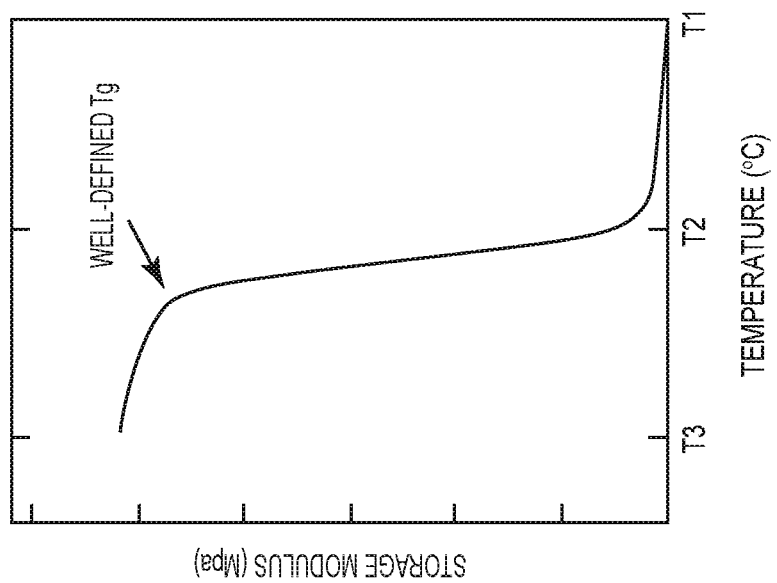
FIG. 4A illustrates a plot of storage modulus versus temperature for a polymer used during the wafer splitting process and which does not contain fillers.

FIGS. 4A and 4B illustrate the storage modulus (modulus of elasticity) in MPa over temperature in ° C. for the same polymer 120 without fillers (FIG. 4A) and with one or more fillers (FIG. 4B). During the second phase of the temperature process, the polymer 120 may undergo a partial glass transition and a partial crystallization process as shown in FIGS. 4A and 4B. The definition of glass transition Tg is not standardized. There are several methods to determine Tg which is not a constant material property but rather depends on the method used to define Tg and also on parameters used during this method. For example, if using the DMA (dynamic mechanical analyzing) method, which measures the viscoelastic moduli, the dynamic glass transition temperature must be stated and also what parameters are used for the measurement (e.g., frequency of the external load, ramping speed, ramping direction, measurement accuracy, etc.).

In FIG. 4A, the glass transition temperature Tg is found at the turning point (at least for some methods of defining Tg). In FIG. 4B, the crystallization starts at higher temperatures (slower slope between T1 and T2) than the glass transition (higher slope below T2) where T3 is below T2 and T2 is below T1. A turning point, and thus Tg, can no longer be clearly determined as compared to the same polymer in FIG. 4A but without fillers.

By adding one or more fillers to the polymer 120, the degrees of freedom in the used polymer crystallize earlier than those of a polymer without fillers. At a temperature above the glass transition, the polymer molecules are flexible and can adopt different conformations, e.g., through bond rotation around flexible Si—O—Si siloxane single bonds ([R3Si—O—SiR3]n). With an increasing temperature reduction, there is a restriction of the existing degrees of freedom and thus a reduction in the mobility of the elastomer molecules, since the necessary activation energy for binding rotation is achieved statistically less often. The frequency of site changes of the polymer molecules decreases with decreasing temperature. Due to the additionally occurring intermolecular interactions between the filler particles and the polymer molecules, the dynamics of the rearrangement of the polymer molecules is reduced as the group vibrations or cooperative movements of the surrounding chains and molecules are reduced due to the lower free volume. At very high filler contents (e.g. >2.0 w %), particle-particle interactions should be accounted for.

The storage modulus (modulus of elasticity) of the polymer 120 has an increase for higher temperatures for the polymer 120 in FIG. 4B which has one or more fillers, compared to the polymer in FIG. 4A with no fillers. Consequently, the slope of the storage modulus increase is lower.

The increase in force during the splitting process is proportional to the storage modulus. Therefore, a lower slope translates into a lower increase in force and thus a smoother force increase, resulting in a smoother crack propagation. Tensions within the semiconductor wafer 100 may be relieved with less wafer breakage outside the separation region 116 by adding one or more fillers to the polymer 120. In contrast, for a higher increase in force, inhomogeneities have a higher impact on the splitting process. The polymer crystallization may lead to lower overall three, but this could be, e.g., compensated for by increasing the thickness of the polymer 120. The temperature gradient and temperature process are preferably chosen such that local temperature differences within the semiconductor wafer 100 are reduced. Excessive local temperature differences can lead to excessive increases in stress and to unwanted fractures within the semiconductor wafer 100.

The semiconductor wafer 100 may have a bevelled edge 136, e.g., as shown in FIG. 5A. The bevelled edge 136 has chamfered outer faces as shown in FIG. 5A. The shape of the bevelled edge 136 may lead to problems when preparing the separation region 116 the position of which is indicated by a dashed line in FIG. 5A. For example, the change in thickness in the bevelled edge 136 may lead to a change in propagation length for a laser beam. Therefore, the focus point of the laser beam changes at the wafer bevel. As a result, the separation region 116 may not continue to the outer rim/edge face 138 of the semiconductor wafer 100. A change in thickness and/or position at the outer rim/edge face 138 of the semiconductor wafer 100 may also hinder implantation of ions to define or pre-define the separation region 116.

To allow for access to the separation region 116 from the outer rim/edge face 138 and thus to facilitate or at least simplify the splitting process, the shape of the bevel may be modified as shown in FIGS. 5B and 5C. According to these embodiments, the bevelled edge 136 of the semiconductor wafer 100 is thinned to a depth T_thin at or below the separation region 116 the position of which is indicated by a dashed line in FIGS. 5B and 5C. Depending on the type of thinning employed, the thinned area may have a square (FIG. 5B) or rounded (FIG. 5C) corner. The bevelled edge 136 of the semiconductor wafer 100 may be thinned by mechanical removal such as by grinding, cutting, by laser ablation, by electro (chemical) discharge machining, by etching, etc.

FIG. 5D shows another embodiment according to which a slot 500 is formed in the bevelled edge 136 of the semiconductor wafer 100 and which laterally extends to the separation region 116 the position of which is indicated by a dashed line in FIG. 5D. The slot 500 may be formed as an alternative or in addition to the thinning shown in FIGS. 5B and 5C. In each case, the bevelled edge 136 of the semiconductor wafer 100 may be processed before or after producing the separation region 116.

During the wafer splitting process, pressure may be applied to the semiconductor wafer 100. For example, a piston may apply pressure to the semiconductor wafer 100 with the one or more epitaxial layers 102. The piston may be pushed in the direction of the wafer 100 with pressurized air, or only the weight force of the piston may be applied to the wafer 100. Such a process is better controlled than dipping (e.g., fully or gradually) the wafer 100 with the polymer 120 into cryogenic fluids (e.g. nitrogen), particularly for spatial resolution of the cooling process.

After the splitting of the semiconductor wafer 100, the piece 124 which retains the device structures 104 may be thinner than the other piece 126. For example, the piece 124 which retains the device structures 104 may have a thickness of at most 100 µm (e.g., at most 70 µm or at most 50 µm) and at least the required thickness of the drift zone as described above (or at least 10 µm more than the required thickness) and the other piece 126 may have a thickness of at least 150 µm (e.g., at least 190 µm).

To allow for re-using the polymer 120 and to avoid breakage of the split wafer pieces 124, 126, polymer removal may be employed. For example, the polymer 120 may be removed by mechanical means both on the device side separation surface 128 (if applicable) and on the reclaimed side separation surface 130 without chemical etching (in general, without chemicals), without plasma etching or other gas phase sputtering processes. The polymer 120 may thus be removed rapidly and in an environmentally friendly and residue-free manner, owing to the attachment processes described herein.

After the wafer splitting, the separation surfaces 128, 130 of the split wafer pieces 124, 126 on which piece 124, 126 is being processed. For the backside of the piece 124 with the device structures 104, a damage removal, e.g., by mechanical grinding and/or chemical mechanical polish and/or etching may be performed. The final roughness of the separation surface 128 after damage removal may have a root-mean-square (rms) value below 5 µm or even below 2 µm. Further processing may then follow. In the case of the piece 126 without the device structures 104, the separation surface 130 may need processing to be ready for subsequent epitaxial growth. In this case, the rms value of the separation surface 130 may be below 500 nm or even below 300 nm. The thickness of the piece 126 without the device structures 104 may be adapted to the original thickness of the wafer 100, e.g., by means of deposition techniques such as CVD-epitaxial techniques, so that the same procedure as described above can be repeated several times for the thickened pieces 126.

The embodiments previously described herein involve splitting a new wafer from a base semiconductor wafer. Alternatively, the splitting techniques described herein may be applied to splitting semiconductor wafers from a semiconductor boule. A semiconductor boule is a single crystal ingot produced by a synthetic means such as the Bridgman technique, the Czochralski process, etc. The splitting techniques described herein may be applied to splitting semiconductor wafers from a semiconductor boule by forming a separation region within a semiconductor boule, the separation region having at least one altered physical property which increases thermo-mechanical stress within the separation region relative to the remainder of the semiconductor bottle. For example, thermo-mechanical stress may be increased within the separation region by focusing laser radiation at a targeted position within the semiconductor boule. An external force is then applied to the semiconductor boule such that at least one crack propagates along the separation region and a wafer splits from the semiconductor boule. In one embodiment, an external force is applied to the semiconductor boule by applying a polymer to the semiconductor boule, the polymer having a CTE different from a CTE of the semiconductor boule. The polymer and the semiconductor boule are subjected to a temperature process during which the polymer imparts mechanical stress to the semiconductor bottle. Also as previously described herein, the thereto-mechanical stress generated within the separation region of the semiconductor boule may be sufficient to bring about wafer splitting, without necessarily requiring application of an external force. In either case, the process may be applied multiple times to yield a plurality of wafers from a single semiconductor boule.

Although the present disclosure is not so limited, the following numbered examples demonstrate one or more aspects of the disclosure.

Example 1. A method of splitting a semiconductor wafer, the method comprising: forming one or more epitaxial layers on the semiconductor wafer; forming a plurality of device structures in the one or more epitaxial layers; forming a metallization layer and/or a passivation layer over the plurality of device structures; attaching a carrier to the semiconductor wafer with the one or more epitaxial layers, the carrier protecting the plurality of device structures and mechanically stabilizing the semiconductor wafer; forming a separation region within the semiconductor wafer, the separation region having at least one altered physical property which increases thermo-mechanical stress within the separation region relative to the remainder of the semiconductor wafer; and applying an external force to the semiconductor wafer such that at least one crack propagates along the separation region and the semiconductor wafer splits into two separate pieces, one of the pieces retaining the plurality of device structures.

Example 2. The method of example 1, wherein forming the separation region within the semiconductor wafer comprises: damaging a material of the semiconductor wafer at a targeted position within the semiconductor wafer.

Example 3. The method of example 2, wherein damaging the material of the semiconductor wafer at the targeted position within the semiconductor wafer comprises: creating a plasma in the material at the targeted position within the semiconductor wafer.

Example 4. The method of example 3, wherein creating the plasma in the material at the targeted position within the semiconductor wafer comprises: focusing laser radiation at the targeted position within the semiconductor wafer.

Example 5. The method of example 2, wherein damaging the material of the semiconductor wafer at the targeted position within the semiconductor wafer comprises: implanting ions into the semiconductor wafer at a depth corresponding to the targeted position within the semiconductor wafer.

Example 6. The method of example 5, wherein the ions are selected from the group consisting of nitrogen ions, phosphorus ions, hydrogen ions, and helium ions.

Example 7. The method of examples 5 or 6, wherein an implantation does of the ions is selected such that the material of the semiconductor wafer damaged by the implanted ions is amorphous or cavities are created.

Example 8. The method of example 2, wherein damaging the material of the semiconductor wafer at the targeted position within the semiconductor wafer comprises: implanting ions into the semiconductor water at a depth corresponding to the targeted position within the semiconductor wafer; and after the ions are implanted, focusing laser radiation at the targeted position within the semiconductor wafer, wherein the implanted ions increase an absorption coefficient in the separation region at a wavelength of the laser radiation.

Example 9. The method of any of examples 1 through 8, further comprising: thinning a bevelled edge of the semiconductor wafer to a depth at or below the separation region.

Example 10. The method of any of examples 1 through 9, further comprising: forming a slot in a bevelled edge of the semiconductor wafer which laterally extends to the separation region.

Example 11. The method of any of examples 1 through 10, wherein applying the external force to the semiconductor wafer comprises: applying ultrasonic vibrations to the semiconductor wafer.

Example 12. The method of any of examples 1 through 11, wherein applying the external force to the semiconductor wafer comprises: applying a polymer to the semiconductor wafer and/or the carrier, the polymer having a CTE (coefficient of thermal expansion) different from a CTE of the semiconductor wafer; and subjecting the polymer and the semiconductor wafer to a temperature process during which the polymer imparts mechanical stress to the semiconductor wafer.

Example 13. The method of example 12, wherein the temperature process is selected such that the polymer undergoes a partial glass transition and a partial crystallization during the temperature process.

Example 14. The method of examples 12 or 13, wherein the temperature process includes a first phase during which the polymer and the semiconductor wafer undergo a temperature gradient from a starting temperature down to room temperature, the starting temperature being 300° C. or less but above room temperature, and a second phase during which the polymer and the semiconductor wafer are further cooled down to a temperature below a glass transition temperature of the polymer.

Example 15. The method of any of examples 12 through 14, further comprising: before the temperature process, adding one or more fillers to the polymer which increase the thermal conductivity of the polymer and reduce a slope of a storage modulus of the polymer.

Example 16. The method of example 15, wherein the one or more fillers comprises ZnO and/or carbon black.

Example 17. The method of any of examples 12 through 16, further comprising: before applying the polymer, chemically and/or physically treating a surface of the polymer and/or a surface of the semiconductor wafer and/or a surface of the carrier.

Example 18. The method of any of examples 12 through 17, wherein the at least one crack propagates during a partial crystallization of the polymer which occurs during the temperature process.

Example 19. The method of any of examples 1 through 18, wherein applying the external force to the semiconductor wafer comprises: applying pressure to the semiconductor wafer during the splitting of the semiconductor wafer into the two separate pieces.

Example 20. The method of any of examples 1 through 19, further comprising: after the semiconductor wafer is split into the two separate pieces, reducing a surface roughness of a separation surface of both pieces of the semiconductor wafer, each separation surface being a surface formed as the at least one crack propagates along the separation region.

Example 21. The method of any of examples 1 through 20, wherein the at least one altered physical property of the separation region comprises a plurality of microscopic cracks that are at least partially disconnected from one another within the separation region, and wherein the plurality of microscopic cracks connect to one another in response to the external force, to form the at least one crack which propagates along the separation region.

Example 22. The method of example 21, wherein the semiconductor wafer is a SiC wafer, and wherein the at least one crack formed by the connection of the plurality of microscopic cracks in response to the external force has a saw-tooth pattern.

Example 23. A method of splitting a semiconductor wafer, the method comprising: forming one or more epitaxial layers on the semiconductor wafer; forming a plurality of device structures in the one or more epitaxial layers; forming a metallization layer and/or a passivation layer over the plurality of device structures; attaching a carrier to the semiconductor wafer with the one or more epitaxial layers, the carrier protecting the plurality of device structures and mechanically stabilizing the semiconductor wafer; applying laser radiation to a separation region within the semiconductor wafer such that the separation region has increased thereto-mechanical stress relative to the remainder of the semiconductor wafer and at least one crack propagates along the separation region; and splitting the semiconductor wafer into two separate pieces along the at least one crack, one of the pieces retaining the plurality of device structures.

Example 24. A method of splitting off a semiconductor wafer from a semiconductor boule, the method comprising: forming a separation region within the semiconductor boule, the separation region having at least one altered physical property which increases thermo-mechanical stress within the separation region relative to the remainder of the semiconductor bottle; and applying an external force to the semiconductor boule such that at least one crack propagates along the separation region and a wafer splits from the semiconductor boule.

Example 25. The method of example 24, wherein applying the external force to the semiconductor boule comprises: applying a polymer to the semiconductor bottle, the polymer having a CTE (coefficient of thermal expansion) different from a CTE of the semiconductor boule; and subjecting the polymer and the semiconductor boule to a temperature process during which the polymer imparts mechanical stress to the semiconductor boule.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of splitting off a semiconductor wafer from a semiconductor boule, the method comprising:
   forming a separation region within the semiconductor boule, the separation region having at least one altered physical property which increases thermo-mechanical stress within the separation region relative to the remainder of the semiconductor boule; and
   applying an external force to the semiconductor boule such that at least one crack propagates along the separation region and a wafer splits from the semiconductor boule,
   wherein applying the external force to the semiconductor boule comprises:
      applying a polymer to the semiconductor boule, the polymer having a CTE (coefficient of thermal expansion) different from a CTE of the semiconductor boule; and
      subjecting the polymer and the semiconductor boule to a temperature process during which the polymer imparts mechanical stress to the semiconductor boule.

2. The method of claim 1, wherein forming the separation region within the semiconductor boule comprises:
   damaging a material of the semiconductor boule at a targeted position within the semiconductor boule.

3. The method of claim 2, wherein damaging the material of the semiconductor boule at the targeted position within the semiconductor boule comprises:
   creating a plasma in the material at the targeted position within the semiconductor boule.

4. The method of claim 3, wherein creating the plasma in the material at the targeted position within the semiconductor boule comprises:
   focusing laser radiation at the targeted position within the semiconductor boule.

5. The method of claim 2, wherein damaging the material of the semiconductor boule at the targeted position within the semiconductor boule comprises:
   implanting ions into the semiconductor boule at a depth corresponding to the targeted position within the semiconductor boule.

6. The method of claim 5, wherein the ions are selected from the group consisting of nitrogen ions, phosphorus ions, hydrogen ions, and helium ions.

7. The method of claim 5, wherein an implantation does of the ions is selected such that the material of the semiconductor boule damaged by the implanted ions is amorphous or cavities are created.

8. The method of claim 2, wherein damaging the material of the semiconductor boule at the targeted position within the semiconductor boule comprises:
   implanting ions into the semiconductor boule at a depth corresponding to the targeted position within the semiconductor boule; and
   after the ions are implanted, focusing laser radiation at the targeted position within the semiconductor boule,
   wherein the implanted ions increase an absorption coefficient in the separation region at a wavelength of the laser radiation.

9. The method of claim 1, wherein the temperature process is selected such that the polymer undergoes a partial glass transition and a partial crystallization during the temperature process.

10. The method of claim 1, wherein the temperature process includes a first phase during which the polymer and the semiconductor boule undergo a temperature gradient from a starting temperature down to room temperature, the starting temperature being 300° C. or less but above room temperature, and a second phase during which the polymer and the semiconductor boule are further cooled down to a temperature below a glass transition temperature of the polymer.

11. The method of claim 1, further comprising:
before the temperature process, adding one or more fillers to the polymer which increase the thermal conductivity of the polymer and reduce a slope of a storage modulus of the polymer.

12. The method of claim 11, wherein the one or more fillers comprises ZnO and/or carbon black.

13. The method of claim 1, further comprising:
before applying the polymer, chemically and/or physically treating a surface of the polymer and/or a surface of the semiconductor boule.

14. The method of claim 1, wherein the at least one crack propagates during a partial crystallization of the polymer which occurs during the temperature process.

15. The method of claim 1, further comprising:
after the wafer splits from the semiconductor boule, forming a new separation region within the semiconductor boule, the new separation region having at least one altered physical property which increases thermomechanical stress within the new separation region relative to the remainder of the semiconductor boule; and
applying an external force to the semiconductor boule such that at least one crack propagates along the new separation region and an additional wafer splits from the semiconductor boule.

* * * * *

UNITED STATES PATENT AND TRADEMARK OFFICE
CERTIFICATE OF CORRECTION

| | |
|---|---|
| PATENT NO. | : 12,356,700 B2 |
| APPLICATION NO. | : 17/781585 |
| DATED | : July 8, 2025 |
| INVENTOR(S) | : C. Beyer et al. |

Page 1 of 1

It is certified that error appears in the above-identified patent and that said Letters Patent is hereby corrected as shown below:

On the Title Page

Item (57) Abstract, Line 2, please change "bottle includes" to -- boule includes --

In the Claims

Column 18, Line 40, (Claim 7, Line 1) please change "implantation does of" to -- implantation dose of --

Signed and Sealed this
Seventh Day of October, 2025

John A. Squires
*Director of the United States Patent and Trademark Office*